United States Patent
Suzuki et al.

(10) Patent No.: US 8,797,023 B2
(45) Date of Patent: Aug. 5, 2014

(54) COERCIVE FORCE SPECIFYING APPARATUS

(75) Inventors: Masafumi Suzuki, Aichi (JP); Tomonari Kogure, Anjo (JP); Mayumi Nakanishi, Anjo (JP)

(73) Assignee: Toyota Jidosha Kabushiki Kaisha, Toyota-shi, Aichi (JP)

( * ) Notice: Subject to any disclaimer, the term of this patent is extended or adjusted under 35 U.S.C. 154(b) by 0 days.

(21) Appl. No.: 14/001,697

(22) PCT Filed: Mar. 7, 2011

(86) PCT No.: PCT/JP2011/055199
§ 371 (c)(1),
(2), (4) Date: Aug. 27, 2013

(87) PCT Pub. No.: WO2012/120609
PCT Pub. Date: Sep. 13, 2012

(65) Prior Publication Data
US 2013/0335064 A1    Dec. 19, 2013

(51) Int. Cl.
*G01R 33/16*    (2006.01)

(52) U.S. Cl.
USPC ...... 324/201; 324/205; 324/207.12; 324/226; 324/238; 324/260; 310/46; 310/154.26; 310/156.01; 310/156.34; 310/156.43; 361/143; 361/147; 361/267

(58) Field of Classification Search
USPC ............ 324/201, 205, 207.12, 226, 228, 260, 324/262; 310/46, 154.26, 156.01, 156.34, 310/156.43; 361/143, 147, 267
See application file for complete search history.

(56) References Cited

U.S. PATENT DOCUMENTS

| | | | | |
|---|---|---|---|---|
| 3,614,618 A | * | 10/1971 | Schrader et al. | 324/201 |
| 5,394,083 A | * | 2/1995 | Jiles | 324/223 |
| 6,201,386 B1 | * | 3/2001 | Jones et al. | 324/205 |
| 6,323,634 B1 | * | 11/2001 | Nakagawa et al. | 324/117 R |
| 8,547,086 B2 | * | 10/2013 | Suzuki et al. | 324/201 |
| 2003/0006758 A1 | * | 1/2003 | Takahashi | 324/201 |
| 2013/0002240 A1 | | 1/2013 | Kogure et al. | |

FOREIGN PATENT DOCUMENTS

| | | |
|---|---|---|
| JP | 50-68372 | 6/1975 |
| JP | 4-64340 | 2/1992 |

(Continued)

*Primary Examiner* — Huy Q Phan
*Assistant Examiner* — Adam Clarke
(74) *Attorney, Agent, or Firm* — Finnegan, Henderson, Farabow, Garrett & Dunner, LLP

(57) ABSTRACT

Provided is a coercive-force specifying apparatus capable of creating a demagnetization curve for each divisional area of a coercive-force distributed magnet without breaking the coercive-force distributed magnet and of specifying an average coercive force for each divisional area precisely.

A coercive force specifying apparatus of the present invention includes: a yoke including an insertion space into which a coercive-force distributed magnet is to be inserted; a magnetizing coil; a search coil that detects a magnetization change when the magnetic field is applied to the coercive-force distributed magnet; and a tracer that creates a demagnetization curve on a basis of a voltage value generated due to the magnetization change. The end face is provided with two or more loop-shaped thread grooves bored therein, the search coil being provided in each thread groove. The coercive-force distributed magnet includes a divisional area defined so as to correspond to each of the two or more search coils, and a voltage value due to a magnetization change detected by each search coil is transmitted to the tracer for creation of a magnetization curve at a corresponding divisional area as well as for specification of an average coercive force.

1 Claim, 7 Drawing Sheets

(56) References Cited

FOREIGN PATENT DOCUMENTS

| JP | 5-264704 | 10/1993 |
| JP | 11-142492 | 5/1999 |
| JP | 2001-141701 | 5/2001 |
| JP | 2006-170951 | 6/2006 |
| JP | 2011-7512 | 1/2011 |
| JP | 2011-22070 | 2/2011 |
| WO | WO 2011/114415 A1 | 9/2011 |

* cited by examiner

Fig. 3
(a)
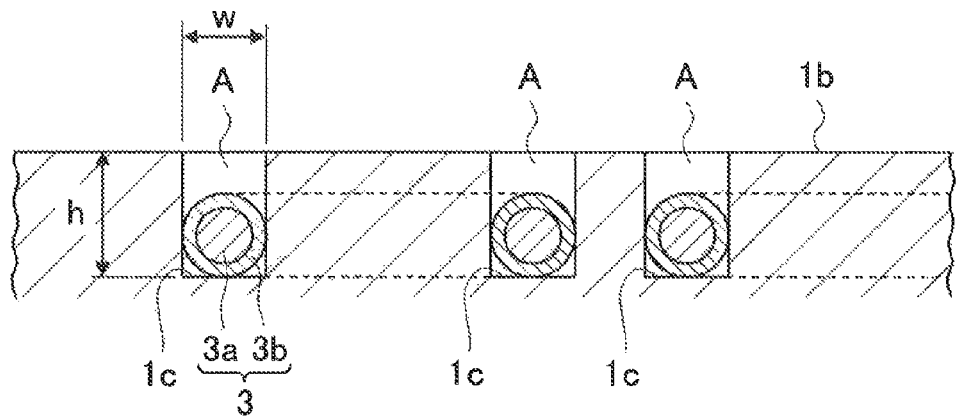
(b)
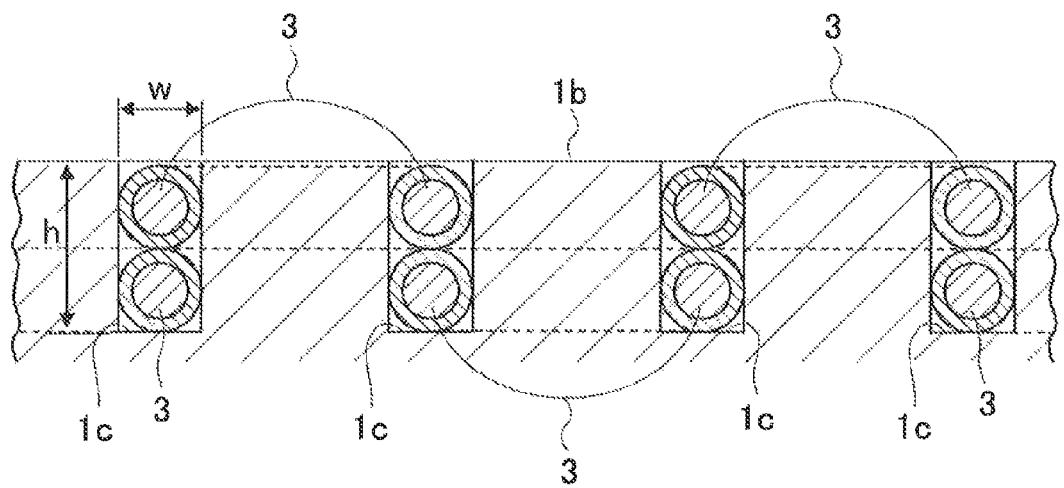

COERCIVE FORCE SPECIFYING APPARATUS

CROSS-REFERENCE TO RELATED APPLICATIONS

This application is a national phase application of International Application No. PCT/JP2011/055199, filed Mar. 7, 2011, the content of which is incorporated herein by reference.

TECHNICAL FIELD

The present invention relates to a coercive force specifying apparatus configured to create a demagnetization curve for each divisional area of a coercive-force distributed magnet used for motors or the like while specifying an average coercive force for the divisional area, and carry out these operations to all of the divisional areas, thus specifying a coercive force of the coercive force distributed magnet.

BACKGROUND ART

A permanent magnet buried in a rotor of an IPM motor or the like is required to have a coercive force so as to resist demagnetization due to external magnetic field entering from a stator core side.

Such external magnetic field acting on the permanent magnet typically becomes the largest at a corner of the permanent magnet on the stator core side in a plan view of the rotor with the permanent magnet buried therein, and becomes smaller on a center side of the rotor core.

Meanwhile, a sintered permanent magnet includes metal particles that are grain-boundary diffused from a surface thereof in order to improve coercive force performance of the permanent magnet, and these metal particles include rare earth such as dysprosium or terbium. Therefore, one of important issues to be solved is, from the viewpoint of a reduction in manufacturing cost of permanent magnets, how to reduce the usage amount of these metal particles while assuring desired coercive force performance.

Since the magnitude of external magnetic field acting on a permanent magnet varies from one part to another of the permanent magnet as stated above, a coercive force required also will vary from one part to another of the permanent magnet. With consideration further given to a reduction in usage amount of rare earth used to enhance the coercive force performance, a coercive-force distributed magnet with a different coercive force for each part of the permanent magnet (with distributed coercive force) is to be manufactured, whereby a permanent magnet can be manufactured so as to minimize the usage amount of rare earth such as dysprosium to allow for a reduction in the manufacturing cost while satisfying the required coercive force performance.

It is very important, from the viewpoint of quality assurance of a coercive-force distributed magnet, to precisely specify the internal coercive force distribution, i.e., an average coercive force for each internal part of a coercive-force distributed magnet. For instance, the coercive-force distributed magnet that is buried in the rotor for IPM motor as stated above may be optimally designed so that the magnetic characteristics of a side part on the stator side becomes relatively favorable, which is attributable to the flow of magnetic flux from the stator side. In that case, it is very important for the future development of a product (such as a magnet) as well as for a magnet maker and a maker using a magnet to precisely specify a coercive force for each internal part of a coercive-force distributed magnet at the stage before the magnet is brought into use and to guarantee the quality of the coercive-force distributed magnet as a specifying target for each desired part more precisely.

Currently, however, a method used is just to break a coercive-force distributed magnet into separated pieces and specify a coercive force thereof. Even when the coercive-force measurement methods disclosed in Patent Documents 1 and 2 as prior arts are used, an average coercive force of a coercive-force distributed magnet as a whole can be just measured, and an average coercive force for each part (for each divisional area) of the coercive-force distributed magnet cannot be specified.

In this way, instead of a conventional specifying method of breaking a coercive-force distributed magnet and specifying a coercive force for each part, an apparatus capable of creating a demagnetization curve for each divisional area obtained by dividing the magnet into any areas without breaking the magnet and specifying an average coercive force for each divisional area has been sought.

Patent Document 1: JP Patent Publication (Kokai) No: 2001-141701 A

Patent Document 2: JP Patent Publication (Kokai) No. 05-264704 A (1993)

DISCLOSURE OF THE INVENTION

Problem to be Solved by the Invention

In view of the aforementioned problems, it is an object of the invention to provide a coercive-force specifying apparatus capable of creating a demagnetization curve for each divisional area obtained by dividing a coercive-force distributed magnet into any areas without breaking the coercive-force distributed magnet and of specifying an average coercive force for each divisional area, and by implementing this to all divisional areas, capable of specifying the coercive force of the coercive-force distributed magnet for each divisional area precisely.

Means for Solving the Problem

In order to achieve the aforementioned object, a coercive force specifying apparatus according to the present invention at least includes: a yoke including an insertion space into which a coercive-force distributed magnet is to be inserted, the coercive-force distributed magnet including parts each having a different coercive force; a magnetizing coil that generates magnetic field at the yoke; a search coil that detects a magnetization change when the magnetic field is applied to the coercive-force distributed magnet; and a tracer that creates a demagnetization curve on a basis of a voltage value generated due to the magnetization change. The yoke may have an end face facing the insertion space, the end face being provided with two or more loop-shaped thread grooves bored therein, in each of the thread grooves the search coil being provided, the search coil including conductive wire and insulating coat surrounding therearound, wherein the coercive-force distributed magnet includes a divisional area defined so as to correspond to each of the two or more search coils, and a voltage value due to a magnetization change detected by each search coil may be transmitted to the tracer for creation of a magnetization curve at a corresponding divisional area as well as for specification of an average coercive force, which may be implemented at all of the divisional areas to specify a coercive force of the coercive-force distributed magnet.

A coercive-force distributed magnet as a specifying target of a coercive-force specifying apparatus of the present invention may be a coercive-force distributed magnet at any timing of during magnet manufacturing, during manufacturing of an IPM motor with this magnet built therein and during manufacturing a vehicle with this IPM motor built therein to check the performance after manufacturing, or a coercive-force distributed magnet taken out from a rotor after the coercive-force distributed magnet is placed in any environment such as after trial run of the vehicle. Examples of this coercive-force distributed magnet include a permanent magnet with coercive-force distribution and for a motor, and may include a three-component system neodymium magnet containing iron and boron added to neodymium, a samarium cobalt magnet containing a two-component system alloy of samarium and cobalt, a ferrite magnet containing ferrioxide powder as a main raw material, and an alnico magnet containing aluminum, nickel and cobalt as raw materials.

The numbers of the loop-shaped thread grooves provided at the end face facing the insertion space of the yoke as a magnetic substance and of the search coils arranged in these thread grooves and the area encompassed by the search coils will change variously depending on the area of the coercive-force distributed magnet and the area of the divisional area whose average coercive-force is to be specified (the divisional area refers to an area surrounded by a search coil, and an average coercive force of each area can be determined by the coercive-force specifying apparatus of the present invention), for example. When two loop-shaped search coils are used, a coercive-force distributed magnet is divided into two divisional areas, and a demagnetization curve is created for each divisional area and an average coercive force is specified for each divisional area. When three loop-shaped search coils are used, demagnetization curves are created for three divisional areas, and their average coercive forces are specified.

As a tracer to create a demagnetization curve, a B-H curve tracer may be used, for example. A voltage value based on a magnetization change of a coercive-force distributed magnet when magnetic field generated by a magnetizing coil is applied to the coercive-force distributed magnet is detected by a search coil, this voltage value is transmitted from the search coil to an integrator built in the B-H curve tracer, and the integrator temporal-integrates the voltage values generated by magnetization changes to calculate magnetic flux density. On the basis of the magnetic flux density, a demagnetization curve (B-H curve, $4\pi$I-H curve) is created.

A coercive force (Hcj) specified from this demagnetization curve becomes an average coercive force for a divisional area of the coercive-force distributed magnet, corresponding to each search coil.

Using the aforementioned coercive-force specifying apparatus, the number of the search coils and their supporting areas are adjusted appropriately, whereby a demagnetization curve can be created for each divisional area of a desired range, and an average coercive force thereof can be specified, and accordingly an average coercive force for each part of the coercive-force distributed magnet can be specified precisely.

Herein, the aforementioned thread grooves preferably have a depth of 1 mm or less.

Magnetic field analysis of the present inventors has demonstrated that the depth of the thread grooves is 1 mm or less and search coils are arranged therein, the search coil including a conductive wire and an insulating coat surrounding therearound, whereby a coercive force of a target area can be specified with precision including an error within 0.1% with reference to the material characteristics value (Hcj) of the coercive-force distributed magnet.

The aforementioned thread grooves preferably have a width of 0.3 mm or less.

Magnetic field analysis of the present inventors has further demonstrated that, with the width of the thread grooves of 0.3 mm or less, a coercive force of a target area can be specified with precision including an error within 0.1% with reference to the material characteristics value (Hcj) of the coercive-force distributed magnet.

In this way, the thread grooves of 1 mm or less in depth and 0.3 mm or less in width are desirable, and with consideration given to the manufacturable dimensions (e.g., dimensions of enameled wires as the insulating coat and the conductive wires made of copper) of the search coils internally provided, the thread grooves may have the depth of 1 mm and the width of 0.3 min, for example.

A coercive force specifying apparatus according to another preferable embodiment of the present invention at least includes: a yoke including an insertion space into which a coercive-force distributed magnet is to be inserted, the coercive-force distributed magnet including parts each having a different coercive force; a magnetizing coil that generates magnetic field at the yoke; a search coil that detects a magnetization change when the magnetic field is applied to the coercive-force distributed magnet; and a tracer that creates a demagnetization curve on a basis of a voltage value generated due to the magnetization change. The yoke may have an end face facing the insertion space, the end face being provided with a resin film and two or more search coils obtained by patterning a conductive material in a loop shape on a surface of the resin film, wherein the coercive-force distributed magnet includes a divisional area defined so as to correspond to each of the two or more search coils, and a voltage value due to a magnetization change detected by each search coil may be transmitted to the tracer for creation of a magnetization curve at a corresponding divisional area as well as specification of an average coercive force, which may be implemented at all of the divisional areas to specify a coercive force of the coercive-force distributed magnet.

In the already-existing form provided with thread grooves at the end face facing the insertion space of the yoke, when the coercive-force distributed magnet is inserted into the insertion space until the surface of the coercive-force distributed magnet is brought into intimate contact with the end face of the yoke, the coercive-force distributed magnet will be brought into contact with an intimate contact face where a magnetic substance (yoke) and an air gap (thread groove) appear alternately, and therefore the coercive-force specifying apparatus tends to have distribution of permeance (referring to the operating point on a demagnetization curve of a magnet. A smaller value of this means larger demagnetization (magnetic field passing in the reverse direction of the magnetization direction of the magnet in the magnet).

On the other hand, according to the apparatus of the present embodiment, instead of providing thread grooves, the resin film as well as two or more search coils as a conductive material patterned in the loop shape on the surface thereof are provided at the end face of the yoke. Thereby, the surface of the coercive-force distributed magnet brought into intimate contact therewith will come in contact with the resin film made of a uniform material, and therefore uniform magnetic field can be applied to the coercive-force distributed magnet. This can suppress the distribution of permeance.

Herein the patterning of the aforementioned conductive material (metal such as copper) may be any form, including printing, etching and the like.

The aforementioned coercive-force specifying apparatus of the present invention is applicable to a coercive force specifying method of a coercive-force distributed magnet described as follows, for example.

This coercive force specifying method of a coercive-force distributed magnet is to specify a coercive force of a coercive-force distributed magnet showing coercive-force distribution in which the coercive force differs in a plane obtained by cutting the coercive-force distributed magnet in a direction along the easy magnetization direction so that the coercive force increases from a center to an outer periphery side in the plane, the method specifying the coercive force at any position in the plane. The method includes the following four steps: a first step of virtually setting a plurality of divisional areas extending in the easy magnetization direction with reference to the plane of the coercive-force distributed magnet and arranging the coercive-force distributed magnet to an opposing magnet field assignment apparatus while arranging search coils at positions corresponding to the divisional areas to create a demagnetization curve specific to each divisional area from the measurement result by each search coil; a second step of specifying a minimum coercive force: $H_{min}$ and an average coercive force $H_{cj}$ from each of the created demagnetization curves, and setting the center position of the divisional area as x1 and positions on the left and right outer periphery side from the center position whose coercive forces are to be specified as ±x2, ±x3; a third step of creating a coercive-force distribution graph using a coordinates system where X-axis represents a distance from the center of the divisional area to the outer periphery side and Y-axis represents a coercive force at each distance using the following assumptions (1) to (3), i.e., (1) assuming that, in the coercive-force distribution graph, the coercive force: $H_{x1}$ at the center position: x1 is the minimum coercive force: $H_{min}$, (2) assuming that when the coercive forces at the positions: ±x2 and ±x3 are $H_{-x2}$, $H_{+x2}$, $H_{-x3}$ and $H_{+x3}$, respectively, $(H_{-x3}+H_{-x2}+H_{x1}+H_{+x2}+H_{+x3})/5$=average coercive force: Hcj, and (3) assuming that $H_{+x2}-H_{x1}=H_{+x3}-H_{+x2}$, and a fourth step of using the aforementioned coercive-force distribution graph specified for each divisional area, specifying a coercive force at any position in the plane in the coercive-force distributed magnet.

This coercive force specifying method is capable of elaborately specifying a coercive force at any position in a plane of the coercive-force distributed magnet, the plane being obtained by cutting the coercive-force distributed magnet in the easy magnetization direction, i.e., a cross section (plane) when the magnet is cut in a direction perpendicular to the slot axis when this magnet is arranged in a rotor slot, the coercive-force distributed magnet showing coercive-force distribution so that the coercive force increases from a center to an outer periphery side in the plane.

Concerning the coercive-force distributed magnet having a rectangular shape in a plan view, one side thereof in the plane is a side face on the stator side and the other side opposed thereto is a side face on the rotor center side.

In general, since heavy rare-earth elements such as dysprosium or terbium are grain-boundary diffused from a surface of a permanent magnet prepared by sintering in order to improve coercive force of the magnet, the coercive-force distributed magnet obtained will show coercive-force distribution such that the coercive force decreases from the outer periphery of the magnet to the center.

Therefore even in the case of a permanent magnet having a rectangular parallelepiped shape, it can be said that the coercive force in a plane obtained by cutting at any level in the height direction has a substantially same tendency, i.e., the tendency such that the coercive force increases concentrically from the center to the outer periphery of the plane.

Thus in a plane obtained by cutting a coercive-force distributed magnet prepared by grain-boundary diffusion of dysprosium or the like at a certain height level, the coercive force distribution in this plane is specified, which is developed in the height direction of the magnet, whereby a coercive force at a three-dimensionally any position (any position in a plane at any height) can be specified.

Firstly at the first step, a plurality of divisional areas are virtually set, extending in the easy magnetization direction with reference to the plane of the coercive-force distributed magnet. Then the coercive-force distributed magnet is provided at the coercive-force specifying apparatus of the present invention, and search coils are arranged at positions corresponding to the divisional areas so as to create a demagnetization curve specific to each divisional area from the measurement result by each search coil.

For instance, when strip-shaped divisional areas along the easy magnetization direction with reference to the magnet plane having a rectangular shape in a plan view are virtually set, the plane of the magnet is provisionally divided into a plurality of strip-shaped areas. When the coercive-force distributed magnet is provided in a rotor slot as stated above, this easy magnetization direction is directed from the rotor center side to the stator side.

Using the coercive-force specifying apparatus of the present invention, external reverse magnetic field is applied to the coercive-force distributed magnet as a specifying target, whereby a demagnetization curve can be created on (the second quadrant of) the coordinates system including the coercive-force coordinates and residual magnetic flux (magnetization) coordinates.

In this specifying method, a search coil is provided at each of the divisional areas virtually divided as stated above, and a demagnetization curve of the divisional area corresponding to each search coil is created.

Herein, illustrating the case where five divisional areas are formed in the aforementioned plane, the center divisional area has a low coercive force, upper and lower divisional areas adjacent thereto have a higher coercive force at the same level, and still upper and lower divisional areas adjacent to these areas tend to have a still higher coercive force at the same level. That is, letting that the center divisional area is BA1, upper and lower adjacent divisional areas in the direction perpendicular to the easy magnetization direction are BA2, 3 and still upper and lower areas adjacent to these areas are BA4, 5, then the magnitude of the coercive force will be BA1<BA2=BA3<BA4-BA5.

Therefore, in the present embodiment, search coils may be provided at three positions in total including the position corresponding to the center divisional area (BA1), the upper divisional area adjacent thereto (BA2) and the still upper divisional area adjacent thereto (BA4) (demagnetization curves for BA2 and BA4 can be used as demagnetization curves for BA3 and BA5, respectively), for example.

Next in the second step, a minimum coercive force: $H_{min}$ and an average coercive force: Hcj are specified from each of the demagnetization curves created, and the center position of the divisional area is set as x1 and the positions whose coercive forces are to be specified: ±x2 and ±x3 are set on the left and right outer periphery side. More specifically, +x2 and +x3 are set on the stator side of the center position: x1, and −x2 and −x3 are similarly set on the rotor center side as well, and at each divisional area, five positions are set on the plane (x1, ±x2, and ±x3).

Herein, based on the created demagnetization curve, the minimum coercive force can be determined as the coercive force at an inflection point (or the point where demagnetization occurs by several % from the maximum magnetic flux density) where the residual magnetic flux density reduces, and the average coercive force can be determined as the point where demagnetization further occurs and the demagnetization curve intersects with the coercive force coordinates.

For instance, when demagnetization curves of three divisional areas are created using three search coils, a minimum coercive force and an average coercive force are set for each of the demagnetization curves.

Needless to say, the coercive force is the smallest at the center position: x1 and increases toward the left and right outer periphery side in the divisional area as in the positions ±x2, ±x3.

Next in the third step, using the following assumptions (1) to (3), a coercive-force distribution graph is created using a coordinates system where X-axis represents a distance from the center of the divisional area to the outer periphery side and Y-axis represents a coercive force at each distance. As the three assumptions, it is assumed that (1) in the coercive-force distribution graph, the coercive force: $H_{x1}$ at the center position: x1 is the minimum coercive force: $H_{min}$, (2) assuming that when the coercive forces at the positions: ±x2 and ±x3 are $H_{-x2}$, $H_{+x2}$, $H_{-x3}$ and $H_{+x3}$, respectively, $(H_{-x3}+H_{-x2}+H_{x1}+H_{+x2}+H_{+x3})/5$=average coercive force: Hcj, and (3) $H_{+x2}-H_{x1}=H_{+3}-H_{+x2}$.

Herein, since $H_{-x3}$ and $H_{+x3}$ (or it $H_{-x2}$ and $H_{+x2}$) represent coercive forces at the same distances from the center position, their values are the same.

Therefore, variables will be practically $H_{+x2}$ and $H_{+x3}$, and $H_{+x2}$ and $H_{+x3}$ can be specified from the aforementioned expressions (2) and (3).

Further, considering the coercive force: $H_{x1}=H_{min}$ at the center position: x1 set in (1), a coercive force distribution graph as a linear function (e.g., $H=kx+H_{min}$ (x is a distance from the center) can be created in the X-Y coordinates system where X-axis represents a distance from the center of the divisional area to the outer periphery side and Y-axis represents a coercive force at each distance.

Effects of the Invention

As can be understood from the aforementioned description, according to the coercive-force specifying apparatus of the present invention allows a demagnetization curve for each divisional area obtained by dividing a coercive-force distributed magnet into any areas to be created without breaking the coercive-force distributed magnet, and enables precise specification of an average coercive force for each divisional area. Accordingly the coercive force that is distributed in the coercive-force distributed magnet can be specified precisely.

BRIEF DESCRIPTION OF THE DRAWINGS

FIG. 3a is an expanded view of part III of FIG. 1, and FIG. 3b corresponds to FIG. 3a, illustrating another embodiment to arrange search coils.

BEST MODE FOR CARRYING OUT THE INVENTION

The following describes embodiments of the present invention, with reference to the drawings. Note here that although illustrated examples show an embodiment in which a coercive-force distributed magnet is tentatively into three divisional areas to create a demagnetization curve of each divisional area and specify an average coercive force, the number of these divisional areas naturally may be two or four or more.

Figure 1:
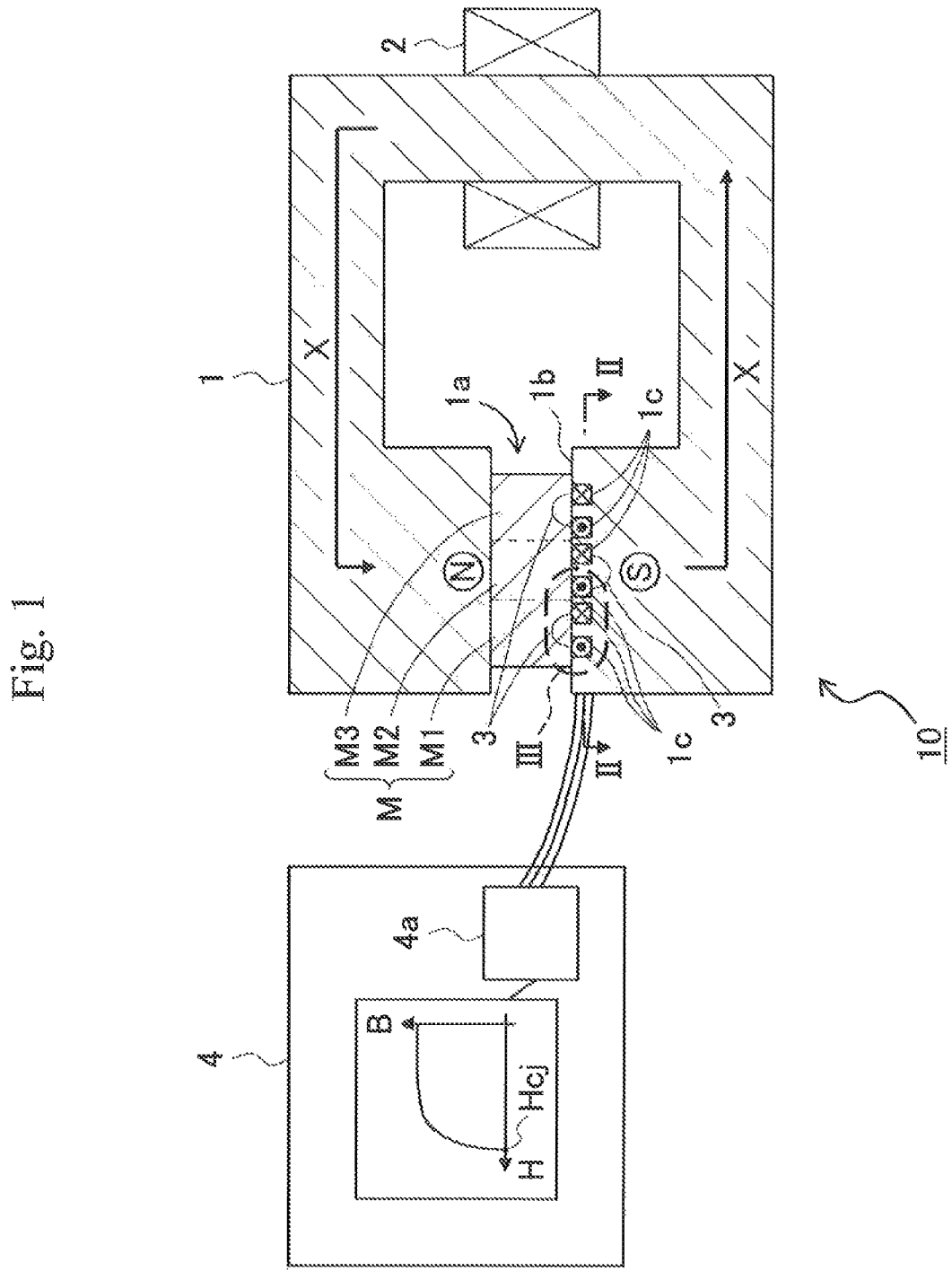
FIG. 1 schematically describes one embodiment of a coercive-force specifying apparatus of the present invention.
Figure 2:
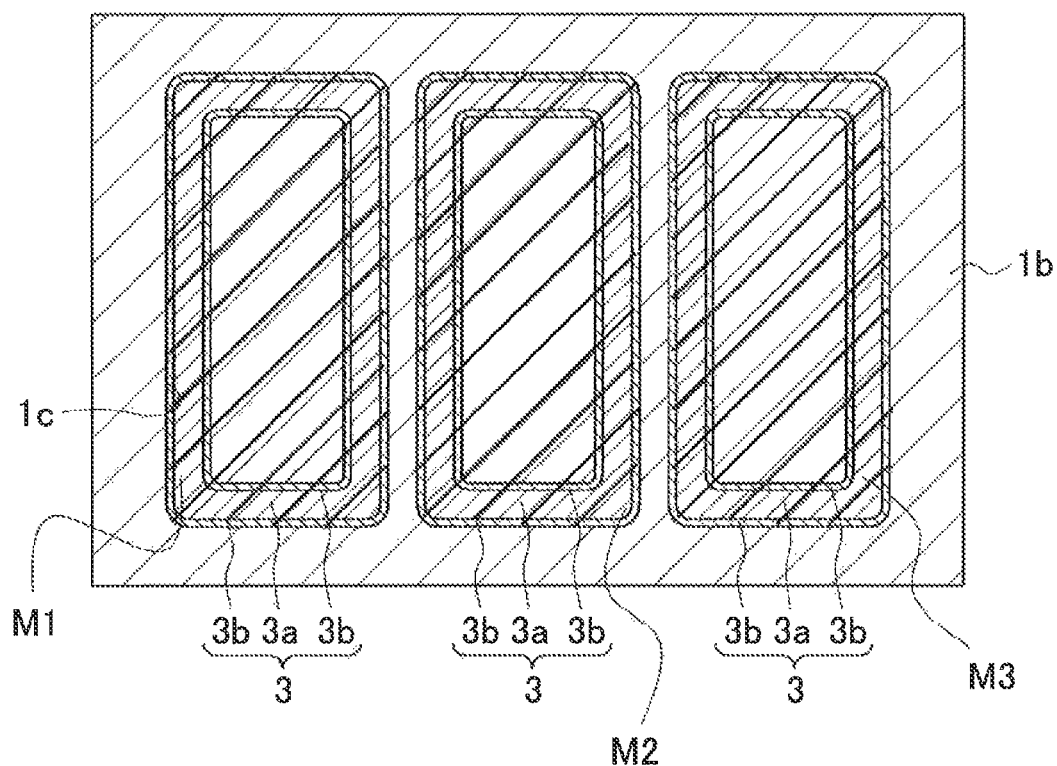
FIG. 2 is a view taken along the line II-II of FIG. 1.

FIG. 1 schematically describes one embodiment of a coercive-force specifying apparatus of the present invention, FIG. 2 is a view taken along the line II-II of FIG. 1, and FIG. 3a is an expanded view of part III of FIG. 1.

The illustrated coercive-force specifying apparatus 10 roughly includes: a yoke 1 of in a substantially C-letter shape in the plan view including an insertion space 1a into which a coercive-force distributed magnet M having a different coercive force for each part is to be inserted; a magnetizing coil 2 that generates magnetic field at the yoke 1 (magnetic flow in X direction); a power supply not illustrated that lets electric current pass through the magnetizing coil 2; a search coil 3 that detects a magnetization change when magnetic field is applied to the coercive-force distributed magnet M; and a tracer (B-H curve tracer) 4 that creates a demagnetization curve on the basis of a voltage value generated with this magnetization change.

As is evident from the plan view of FIG. 2, the yoke 1 has an end face 1b facing the insertion space 1a, and the end face 1b includes three loop-shaped thread grooves 1c, 1c, 1c bored therein, in each of which 1c the search coil 3 is provided, the search coil 3 including conductive wire 3a made of copper and insulating coat 3b surrounding therearound.

In this coercive-force distributed magnet M, divisional areas M1, M2 and M3 of the coercive-force distributed magnet, each corresponding to the search coil 3, are defined, and the conductive wire extending from each search coil 3 is connected with an integrator 4a built into the tracer 4.

When magnetic field generated at the magnetizing coil 2 is applied to the coercive-force distributed magnet M, a magnetization change occurs in the coercive-force distributed magnet M, and a voltage value based on this magnet change is detected by the search coil 3.

The detected voltage value is transmitted from the search coil 3 to the built-in integrator, and the integrator 4a temporal-integrates the voltage values and calculates magnetic flux density. On the basis of the magnetic flux density, a demagnetization curve (B-H curve, 4πI-H curve) is created for each of the divisional areas M1, M2 and M3 (the area surrounded by the each search coil).

A coercive force (Hcj) is specified from the created demagnetization curve for each of the divisional areas M1, M2, and M3, which becomes an average coercive force for each divisional area.

Herein as for the loop-shaped groove depth h and the groove width w (see FIG. 3a) bored in the end face 1b, the magnetic field analysis result described later shows that the groove depth h is preferably 1 mm or less and the groove width w is preferably 0.3 mm or less. Further with consideration given to the manufacturable dimensions (e.g., dimensions of enameled wire as the insulating coat and the conductive wire made of copper) of the search coils internally provided, the thread grooves may have the depth of 1 mm and the width of 0.3 mm, for example. In this drawing, inside the thread groove 1c is contained the search coil 3, above which (the coercive-force distributed magnet side) air gap A is formed.

Instead of the coil provision manner of the coils of FIG. 3a, as illustrated in FIG. 3b, two coils 3 may be contained in one thread groove 1c so as to overlap one another.

Herein, the coercive-force distributed magnet M as a specifying target may be a magnet formed so that a coercive force thereof is desirably distributed by grain-boundary diffusing dysprosium, terbium or the like through a surface of a sintered permanent magnet to be buried in a rotor not illustrated making up an IPM motor, for example. Then, examples of this permanent magnet include a three-component system neodymium magnet containing iron and boron added to neodymium, a samarium cobalt magnet containing a two-component system alloy of samarium and cobalt, a ferrite magnet containing a ferrioxide as a main raw material, and an alnico magnet containing aluminum, nickel and cobalt as raw materials.

The coercive-force specifying apparatus 10 used allows a demagnetization curve for each divisional area obtained by dividing the coercive-force distributed magnet into any areas to be created without breaking the coercive-force distributed magnet, for example, and enables precise specification of an average coercive force for each divisional area. By implementing this for all divisional areas, the coercive force of the coercive-force distributed magnet can be precisely specified for each divisional area.

Figure 4:
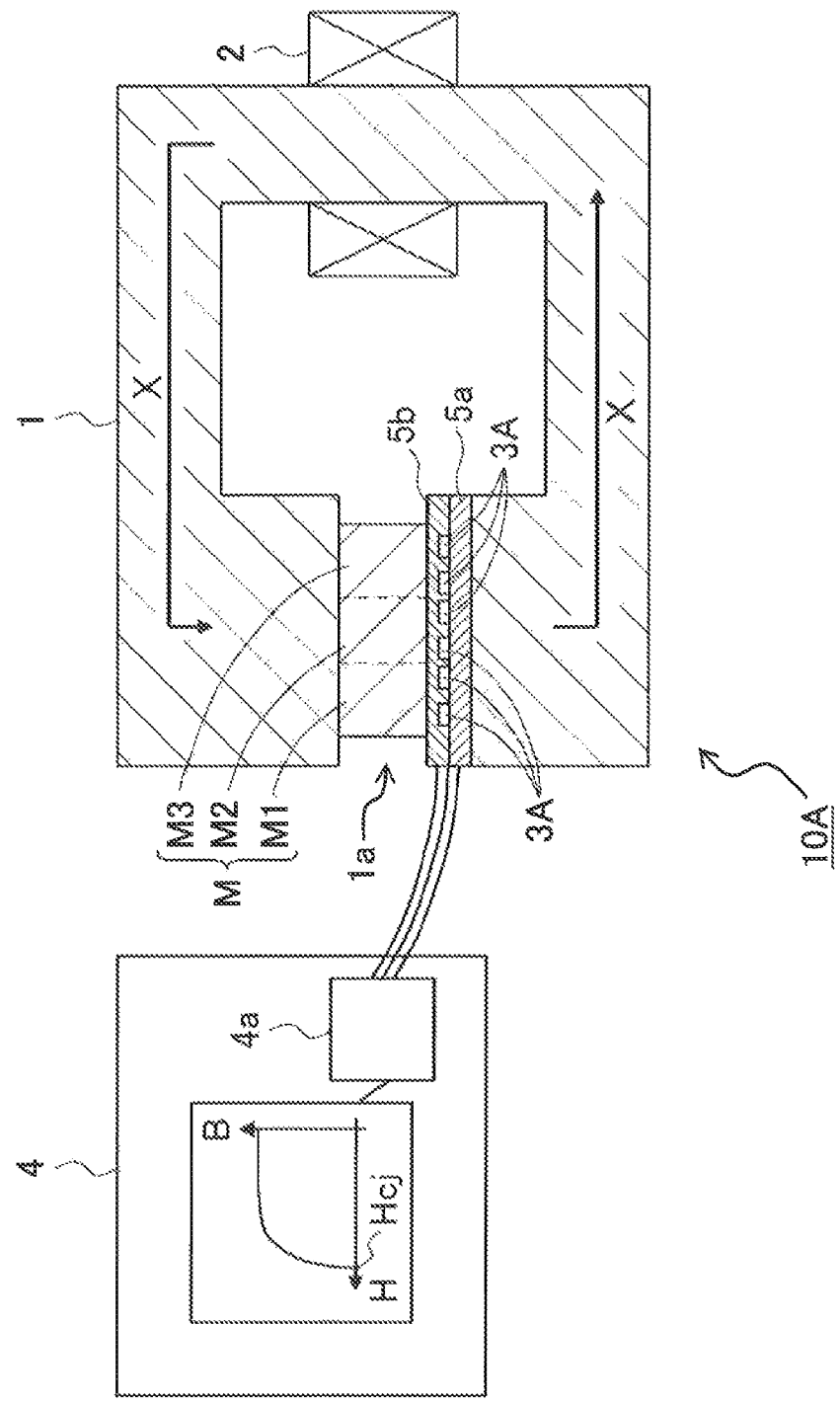
FIG. 4 schematically describes another embodiment of a coercive-force specifying apparatus of the present invention.

FIG. 4 schematically describes another embodiment of a coercive-force specifying apparatus of the present invention.

A coercive-force specifying apparatus 10A illustrated includes a yoke 1 with an end face 1b facing an insertion space 1a, and at the end face 1b are provided three search coils 3A, 3A, 3A that are a conductive material patterned in the loop shape on the surface of a resin film 5a. A separate resin film 51 is further provided so as to sandwich the search coils 3A with the resin film 5a. The coercive-force specifying apparatus 10A is configured so that, in this coercive-force distributed magnet M, divisional areas M1, M2 and M3 are defined so as to correspond the three search coils 3A, 3A, 3A, respectively, and a voltage value due to a magnetization change detected by the respective search coils 3A is transmitted to the tracer.

Herein the patterning of a conductive material such as copper may include the forms of printing, etching and the like.

The coercive-force specifying apparatus 10 illustrated in FIG. 1 tends to have distribution of permeance because, when the coercive-force distributed magnet M is inserted into the insertion space 1a until the surface of the coercive-force distributed magnet M is brought into intimate contact with the end face 1b of the yoke 1, the coercive-force distributed magnet M is brought into contact with an intimate contact face where a magnetic substance (yoke 1) and an air gap A (thread groove 1c) appear alternately.

Then, the coercive-force specifying apparatus 10A is used so that, instead of providing thread grooves, the resin films 5a and 5b as well as the three search coils 3A, 3A, 3A as a conductive material patterned in the loop shape on the surfaces thereof are provided at the end face 1b of the yoke 1. Thereby, the surface of the coercive-force distributed magnet M brought into intimate contact therewith will come in contact with the resin film 5b made of a uniform material, and therefore uniform magnetic field can be applied to the coercive-force distributed magnet M. This can suppress the distribution of permeance.

[Magnetic Field Analysis and a Result Thereof]

The present inventors performed magnetic field analysis to specify an optimum groove depth range and such a groove width range of the thread grooves in the coercive-force specifying apparatus 10 illustrated in FIG. 1.

Figure 5:
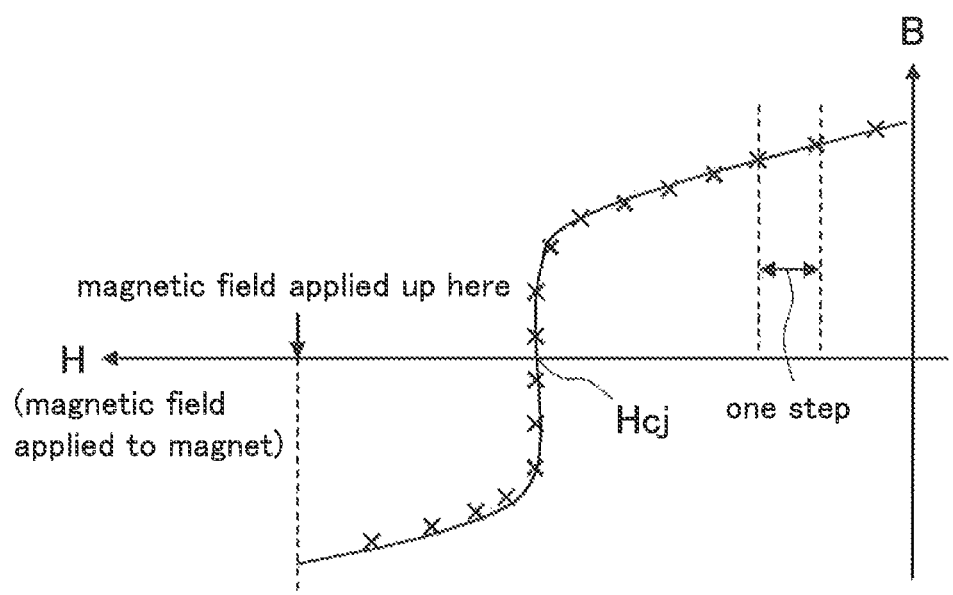
FIG. 5 shows excitation magnetic field (horizontal axis) obtained by the present apparatus and a magnetization change (vertical axis) of the magnet acquired by the search coils.

As the analysis conditions, the number of turns of the magnetizing coil was 140, current of 0.1 A/step was applied to the magnetizing coil until it reached the magnetic field to be applied (see FIG. 5 representing the excitation magnetic field acquired by the present apparatus (horizontal axis) and the magnetization change (vertical axis) of the magnet acquired by the search coils), and a magnetic field value of a coercive force (Hcj) or more of the magnet to be input for the analysis was set as a magnet applied magnetic field (see FIG. 5).

Figure 6:
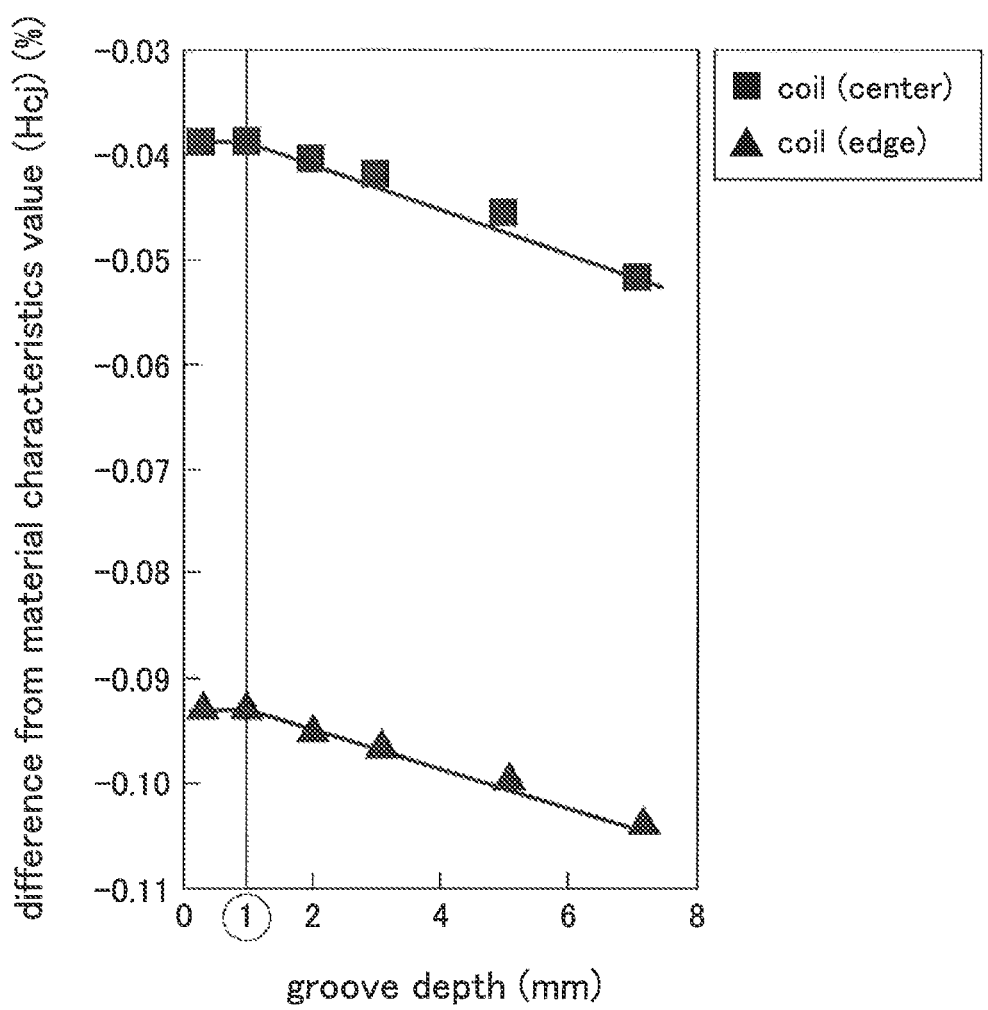
FIG. 6 is a graph showing a magnetic field analysis result concerning a difference between the magnet coercive forces determined from the apparatus including thread grooves of different groove depths and the coercive force specified from the magnetic material characteristics value.

For analysis to specify the optimum groove depth range, the groove width was set at 0.3 mm, and the groove depth was changed from 0 mm to 7 mm. Then, a magnet coercive force was found using an apparatus having thread grooves of each groove depth, and a difference between the found magnet coercive force and a coercive force (real value) specified from the magnet material characteristics value was found. FIG. 6 shows the result.

On the other hand, for analysis to specify the optimum groove width range, the groove depth was set at 0.8 mm, and the groove width was changed from 0.15 mm to 0.45 mm. Then, a magnet coercive force was found using an apparatus having thread grooves of each groove width, and a difference between the found magnet coercive force and a coercive force (real value) specified from the magnet material characteristics value was found, FIG. 7 shows the result.

Figure 7:
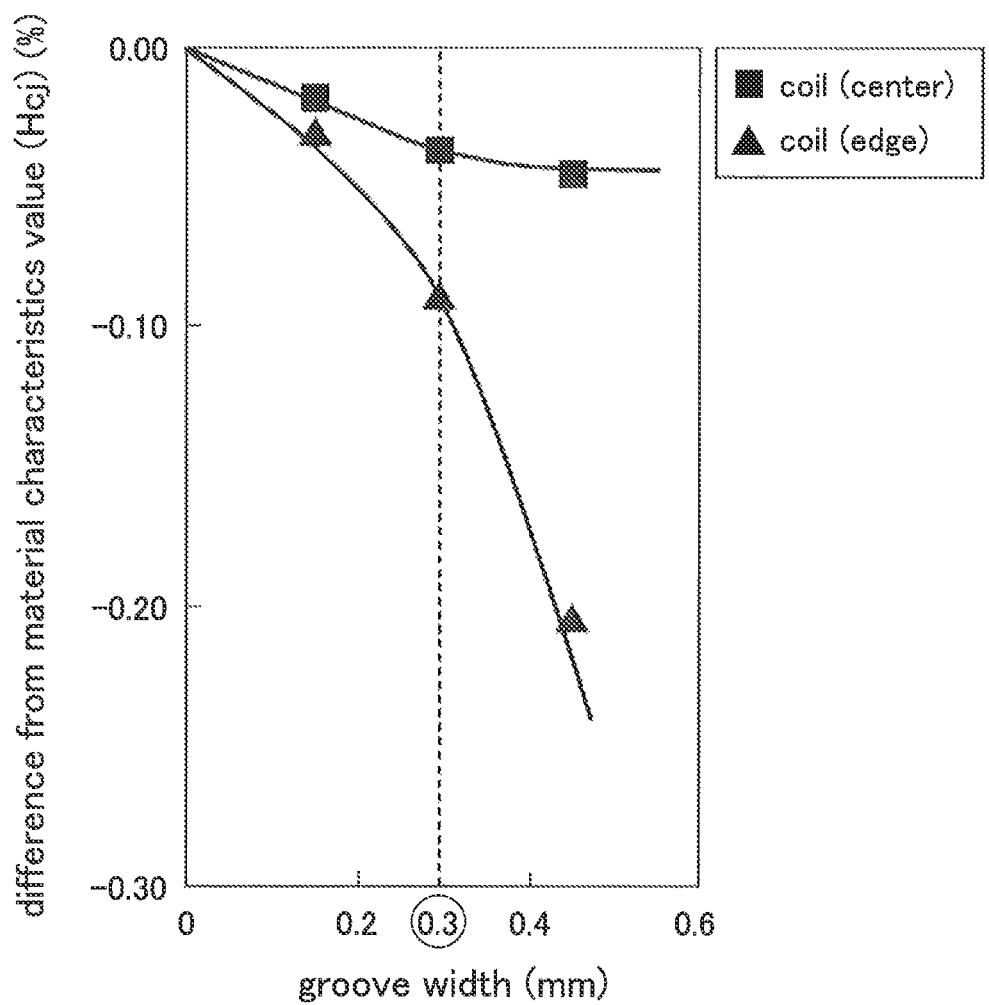
FIG. 7 is a graph showing a magnetic field analysis result concerning a difference between the magnet coercive forces determined from the apparatus including thread grooves of different groove widths and the coercive force specified from the magnetic material characteristics value.

Note here that both of FIG. 6 and FIG. 7 used search coils located at two positions of a center and an end part of the magnet to find a difference from the coercive force (real value). The center of the magnet refers to the central divisional area M2 in the coercive-force distributed magnet M illustrated in FIG. 1, for example, and the end part of the magnet refers to the divisional area M1 or the divisional area M3 illustrated in the same FIG. 1.

It is demonstrated in FIG. 6 that the groove depth exceeding 1 mm tends to increase a difference from the magnet material characteristics value, where the groove depth of 1 mm becomes the inflection point thereof. Based on this result, the optimum groove depth range was defined at 1 mm or less.

On the other hand, it is demonstrated from FIG. 7 that the groove width exceeding 0.3 mm tends to increase a difference from the magnet material characteristics value remarkably, where the groove width of 0.3 mm becomes the inflection point thereof. Based on this result, the optimum groove width range was defined at 0.3 mm or less.

Although that is a detailed description of the embodiments of the present invention with reference to the drawings, the specific configuration is not limited to the above-stated embodiments, and it should be understood that we intend to cover by the present invention design modifications without departing from the spirits of the present invention.

DESCRIPTION OF REFERENCE NUMBERS

1: Yoke
1a: Insertion space
1b: End face facing insertion space
1c: Thread groove
2: Magnetizing coil

3, 3A: Search coil
3a: Conductive wire
3b: Insulating coat
4: Tracer
4a: Integrator
5a, 5b: Resin film
10, 10A: Coercive-force specifying apparatus
M: Coercive-force distributed magnet (permanent magnet)
M1, M2, M3: Divisional area

The invention claimed is:

1. A coercive force specifying apparatus, at least comprising: a yoke including an insertion space into which a coercive-force distributed magnet is to be inserted, the coercive-force distributed magnet including parts each having a different coercive force; a magnetizing coil that generates magnetic field at the yoke; a search coil that detects a magnetization change when the magnetic field is applied to the coercive-force distributed magnet; and a tracer that creates a demagnetization curve on a basis of a voltage value generated due to the magnetization change, wherein the yoke has an end face facing the insertion space, the end face being provided with two or more loop-shaped thread grooves of 1 mm or less in depth and 0.3 mm in width bored therein, in each of the thread grooves the search coil being provided, the search coil including conductive wire and insulating coat surrounding therearound, wherein the coercive-force distributed magnet includes a divisional area defined so as to correspond to a plurality of search coils, and a voltage value due to a magnetization change detected by each search coil is transmitted to the tracer for creation of a magnetization curve at a corresponding divisional area as well as for specification of an average coercive force, which is implemented at all of the divisional areas to specify a coercive force of the coercive-force distributed magnet.

* * * * *